United States Patent [19]

Urushiwara et al.

[11] Patent Number: 4,893,215
[45] Date of Patent: Jan. 9, 1990

[54] ELECTRONIC CIRCUIT APPARATUS OF AUTOMOBILE

[75] Inventors: Noriyoshi Urushiwara, Katsuta; Noboru Kobayashi, Mito; Ryoichi Kobayashi, Naka, all of Japan

[73] Assignee: Hitachi, Ltd., Tokyo, Japan

[21] Appl. No.: 247,507

[22] Filed: Sep. 22, 1988

[30] Foreign Application Priority Data

Sep. 30, 1987 [JP] Japan .................. 62-243819

[51] Int. Cl.⁴ ............................................. H05K 7/14
[52] U.S. Cl. .................. 361/395; 174/52.3; 361/387; 357/74
[58] Field of Search ............. 174/52.3, 52.2; 361/380, 386–388, 392, 395, 417, 419, 420; 357/74, 81

[56] References Cited

U.S. PATENT DOCUMENTS

| | | | |
|---|---|---|---|
| 3,876,926 | 4/1975 | Schott | 361/387 |
| 4,086,752 | 5/1978 | Kishimoto | 174/52.3 |
| 4,691,265 | 9/1987 | Calver | 361/386 |
| 4,748,294 | 5/1988 | Bartel | 174/52.3 |
| 4,788,626 | 11/1988 | Neidig | 361/386 |
| 4,811,165 | 3/1989 | Currier | 361/386 |

FOREIGN PATENT DOCUMENTS 59-208800 11/1984 Japan .
60-213095 10/1985 Japan .

Primary Examiner—Gerald P. Tolin
Attorney, Agent, or Firm—Antonelli, Terry & Wands

[57] ABSTRACT

Electronic circuits (11,12) are mounted on a metal base (13). The metal base is covered by a mold resin case (16) at the peripheral portion thereof. A projected portion (29) is formed along all the peripheral edge portion of the metal base. A step portion is formed to the metal base next to the projected portion of the metal base. A groove (28) is formed along all the peripheral portion of the bottom surface of the mold resin case. The projected portion is engaged to the groove which is filled with a bonding material (33). The bottom surface of the step portion is also covered by the bonding material when the projected portion is thrust into the groove of the mold resin case.

7 Claims, 1 Drawing Sheet

ELECTRONIC CIRCUIT APPARATUS OF AUTOMOBILE

FIELD OF THE INVENTION

The present invention relates to an electronic circuit apparatus for an automobile and more particularly, the present invention relates to a sealing structure for an electronic circuit apparatus for an automobile which is effective for withstanding salt damage or thermal shock.

BACKGROUND OF THE INVENTION

Conventionally, an electronic circuit apparatus for controlling an engine, etc. for an automobile, is formed in such a manner that electronic parts are mounted and wired within a case forming a partition molded together with input and output terminals on a metal substrate made of aluminum etc., and the case if case is fixed by a resin cover from the underside thereof using bonding material etc. for sealing the electronic circuit apparatus as disclosed, for instance, on FIGS. 1 and 2 of Japanese patent Laid-Open No. 59-208800 published on Nov. 27, 1984 in the title of "Electronic Apparatus of Automobile".

Further, a sealing structure of an electronic circuit apparatus is disclosed, for instance, in FIG. 3 of Japanese Patent Laid-Open No. 60-213095 published on Oct. 25, 1985, and entitled "Electronic Circuit Apparatus", in which a recessed portion is provided on an upper surface of an outer wall of a metal case in which electronic parts are encased in a resin, a metal cover is engaged to the recessed portion of the flange of the metal case, and after that the thermosetting resin is cured in the recessed portion.

However, in the former structure, when the electronic circuit apparatus is used under the condition in which a difference of thermal expansion coefficients between the resin partition and the metal substrate is large, slight peeling occurs between the bonded interfaces. And there is such a problem that the peeling will spread and salt water will be introduced into the peeled interfaces, when salt is spread on a surface of the road in winter, with the result that the salt water is introduced into the peeled interfaces, and the salt is crystallized at the peeled interfaces.

In the latter prior art, it is proposed that a high density and hard epoxy resin, in which the thermal expansion coefficient thereof is nearly equal to the metal, is used as the thermosetting resin for bonding the case and the cover in order to solve the above-mentioned problem. However, the thermosetting resin can not be applied to the metal substrate and the resin partition. Namely, when the sealing structure of the latter is applied to the metal substrate and the resin partition for connecting both, peeling occurs at the bonded interface of the thermosetting resin and the metal based on the difference of the thermal expansion coefficients therebetween. Further, when the salt water is splashed on the electronic circuit apparatus, the salt water is adhered to the interval between the case and the cover, the adhered salt water is crystallized therein, and the connection among the case, the cover, and the bonding material is broken by the force which is activated to peel the resin and the bonding material. Particularly, when a gap between the case and the cover is small, the sealing is remarkably destroyed by the salt water.

SUMMARY OF THE INVENTION

An object of the present invention is to provide a sealing structure for an electronic circuit apparatus which is able to secure the sealing sufficiently to seal water or thermal shock so that the electronic circuit apparatus is profitable for mounting on a vehicle such as an automobile.

For attaining the object explained above, in an electronic circuit apparatus of an automobile comprising a metal base mounted on the electronic circuit; a mold resin case which is connected to a peripheral portion of the metal base, forms a space together with the metal base for enclosing the electronic circuit therein, and molds a connector which is used for inputting and outputting an electric signal from the electronic circuit; the present invention is characterized in that the mold resin case has a groove along all the peripheral portion of a bottom surface thereof; the metal base forms a projection along all the peripheral portion of an edge thereof; and a bonding material which is filled in the groove of the bottom of the mold resin case engages the projection of the metal case, wherein bonding material covers a surface of the step portion of the metal base.

According to the structure of the present invention, the step portion is formed as an annex to the projected portion of the metal base which is inserted into the groove of the molded resin case. Since the bonding material is filled in the step portion of the metal base, the gap formed by the metal base and the mold resin case can be large. Consequently, even if salt water is splashed on the electronic circuit apparatus and the adhesive salt in the gap is crystallized, the connection interface with the bonding material is not peeled off and the electronic circuit apparatus can be secured sufficiently in sealing.

DETAILED DESCRIPTION OF THE PREFERRED EMBODIMENTS

Figure 1:
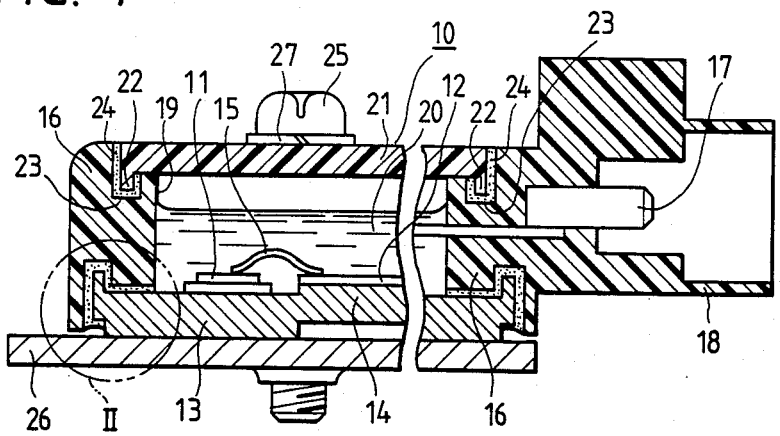
FIG. 1 shows a sectional view of a sealing structure of an ignition power module of the present invention.

Referring to FIG. 1, the ignition power module 10 has a power transistor, which consumes a number of watts of electric power in a control circuit thereof, and is equipped within the engine room. Namely, the power module 10 inputs a control signal from an ignition timing control device (not shown), controls the interruption of the primary current of the ignition coil so as to generate a high voltage signal at the secondary side of the ignition coil.

The ignition power module 10 mounts a silicon substrate 11 comprising the power transistor and a hybrid IC substrate 12 comprising the control circuit within the inside thereof. An aluminum base 13 plated by Ni coating on the surface thereof is equipped on the inner bottom surface of the power module 10. The substrate 11 comprising the power transistor is soldered on the aluminum base 13. The hybrid IC substrate 12 of the control circuit is fixed to the aluminum base 13 at the right side next to the substrate 11 by a flexible bonding material such as silicon bonding material which is able to absorb a stress caused by any difference of thermal expansion coefficients. The aluminum base 13 is cut and arranged in a certain configuration, for instance, by a press processing. In the above embodiment, a projected portion 14 is formed at one portion of the surface of the aluminum base 13 as shown in FIG. 1. The IC substrate 12 is fixed on the surface of the projected portion 14. The projected portion 14 is made for coinciding the height of the transistor substrate 11 with that of the surface of the control circuit IC substrate 12. According to the structure, the connection by the aluminum wire 15 arranged between the power transistor substrate 11 and the control circuit IC substrate 12 is carried out stably and certainly so that durability of the terminal connection can be secured. The mold case 16 is equipped around the outer peripheral end portion of the aluminum base 13 for forming a space in which the power transistor substrate 11 and the control circuit IC substrate 12 are accommodated within the mold case. The input and output terminals 17 are molded at the right side wall of the mold case 16 for connecting electrically to the ignition timing control device and the ignition coil as shown in FIG. 1. At the pointed end of the input and output terminal 17, the insertion port 18 is formed. In the embodiment, the mold case 16 is formed, for instance, by molding polybutylene terephthalate (hereunder, PBT).

As shown in FIG. 1, the open portion 19 is formed at the upper side of the mold case 16. The power transistor substrate 11 and the control circuit IC substrate 12 are fixed on the aluminum base 13. After electrical connection between each substrate or the substrates and the input and output terminals 17 is finished, the space accommodating the substrates is filled, for instance, by silicon gel 20. After that, the cover 21 is put on the mold case 16. The cover 21 is constituted by arranging PBT as well as the mold case 16. The projection portion 22 is formed at the peripheral end portion. The projection portion 22 is engaged to the recessed portion 23 formed in the upper end portion of the mold case 16. After that, the cover 21 is fixed to the mold case 16 by the bonding material 24.

The ignition power module 10 is mounted on the fixing stay 26 by the fixing nut as shown in FIG. 1. The mold case 16 is molded together with, for instance, a metal cylindrical collar (not shown). The fixing nut 25 is screwed in the tapped hole formed at the fixing stay 26 through the metal collar for fixing the ignition module 10 thereto. The reference numeral 27 is a washer inserted between the fixing nut 25 and the mold case 16.

Figure 2:
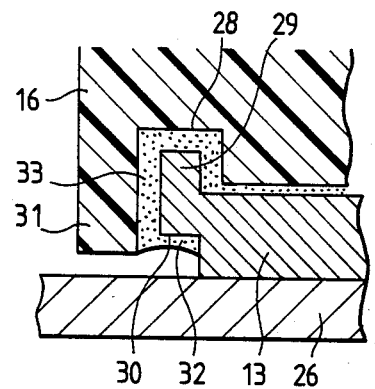
FIG. 2 shows a partial enlarged view showing a sealing structure of FIG. 1 in detail.

FIG. 2 shows a detailed structure showing connection between the aluminum base 13 of the ignition power module 10 and the mold case 16 made from PBT (namely, the portion shown by the dashed line II in FIG. 1). As shown in FIG. 2, the recessed portion 28 is provided along the all peripheral portion of the lower end portion of the mold case 16. On the other hand, the projected portion 29 is provided at the rising portion of the periphery of the aluminum base 13. The projected portion 29 of the aluminum base 13 is engaged to the recessed portion of the mold case 16. The step portion 30 is formed on the aluminum base 13 along the all periphery of the end portion of the lower surface which is opposite to the surface in which the projected portion 29 is formed. The height from the bottom surface of the aluminum base 13 of the step portion 30 is higher than that of the bottom surface 31 of the outer wall of the mold case 16. The step portion 30 forms a stay portion of the bonding material together with the outer wall portion of the mold case 16.

In such a connecting structure, at first, the bonding material 33 is filled to the recessed portion 28 at the mold case 16. Next, the projected portion 29 of the aluminum base 13 is inserted to the recessed portion 28 of the mold case 16. Accordingly, as shown in FIG. 2, the bonding material 33 is spread at the gap between the mold case 16 and the aluminum base 13. At the same time, the bonding material 33 is stored at the stay portion 32 of the bonding material which is formed by the outer wall portion 31 of the mold case and the step portion 30 of the aluminum base 13.

In the connecting structure explained above, since the projected portion 29 of the aluminum base 13 is engaged to the recessed portion 28 of the mold case 16, a shearing force is not occurd at the bonded interface. Even if salt water is splashed on the connecting portion, and the salt is crystallized therein, the connecting surface of the bonding material 32 and the mold case 16 is not peeled off, crack is not occurd, and connecting structure having high withstanding against salt damage can be formed, since the outer surface of the stay portion 32 of the bonding material can be formed wide comparatively.

Since the stay portion 32 of the bonding material is provided, the bonding material is not extruded on the bottom surface of the aluminum base 13, the aluminum base 13 is able to be fixed closely on the stay 26, and the electronic circuit apparatus of the present invention can be fixed in a state having good thermal conductivity without increasing thermal resistance of the power module 10 which generates heat.

When the bonding material is extruded on the bottom portion of the aluminum base 13, a layer of the bonding material or air is produced between the aluminum base 13 and the fixing stay 26. The bonding material or air is a material which is not good at conducting heat. Resistance of thermal conductivity can be denoted as thermal resistance. When Tj denotes junction temperature (chip temperature of the power transistor), and Tc temperature of the fixing stay, temperature difference $\Delta T$ between the junction and the stay is as follows:

$$\Delta T = Tj - Tc \tag{1}$$

When $Q_{jc}$ is thermal resistance between the junction and the stay, and P consumption power of the power transistor, the formula (1) is as follows:

$$\Delta T = Q_{jc} \cdot P \tag{2}$$

When the bonding material is extruded on the bottom portion of the aluminum base, and the layer of the bonding material or air is produced between fixing stay and the bottom portion, $Q_{jc}$ shown in the above formula is increased. This means increasing of $\Delta T$ as apparent from the above formula.

Especially, in the ignition power module, Tc becomes approximately 100° C. On the other hand, when the power transistor chip is not used under the junction temperature of 140°–150° C., the chip is broken. Accordingly, the temperature rise $\Delta T$ must be suppressed as for as possible.

Figure 3:
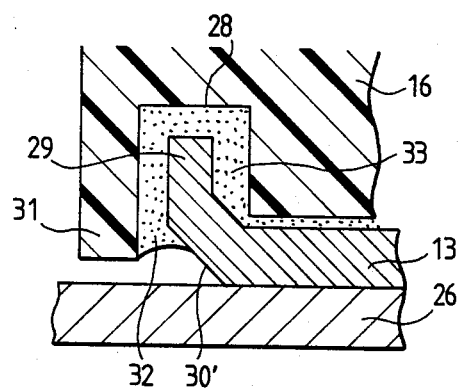
FIG. 3 shows another embodiment of a partial enlarged view of the sealing structure of the present invention.

Referring to FIG. 3, the inclined portion 30' is formed instead of the step portion 30 in FIG. 2 which is formed next to the projected portion 29 at the peripheral end portion of the aluminum base 13. According to the embodiment shown in FIG. 3, the inclined portion 30' is formed by bending the peripheral end portion of the aluminum base 13. According to the apparatus shown in FIG. 3, variation of the gap of the molding material 32 which is inserted between the aluminum base 13 and the mold case 16 is moderate so that peeling of the bonding material does not occur frequently.

In the above embodiments, it is explained that the base 13 and the mold case 16 are made from aluminum and PBT, respectively, The present invention is not limited to the above-mentioned embodiments. Namely, it is possible that the base made from copper or iron is used instead of the aluminum base as the base 13. The same effect can be attained by using polyphenylen sulfide (PPS) or polypropylene (PP) etc. other than PBT as the mold material.

In the above embodiments, the electronic circuit accommodated within the sealing structure is described as the power module which is equipped with the power transistor. The present invention is not limited to the above-mentioned embodiments. The electronic circuit can be applied to any other electronic circuit apparatus of an automobile.

According to the present invention, the shearing force, which is activated at the interface of the bonding material caused by temperature variation, can be reduced as apparent from the above explanation. By adopting the stay portion of the bonding material, the connecting interface is not peeled off or is not damaged by crack which might be caused by the crystallization of salt splashed to the apparatus. Accordingly, the present invention can supply the sealing structure of the electronic circuit apparatus which is mounted on an automobile.

What we claim is:

1. An electronic circuit apparatus of an automobile comprising a metal base which mounts electronic circuits; a mold resin case which is connected to a peripheral portion of the metal base, and forms a space together with the metal base enclosing the electronic circuits therein, said case including a molded connector which is used for inputting and outputting an electric signal from the electronic circuits; said molded resin case having a groove along all of the peripheral portion of a bottom surface thereof, said metal base forming a projection along all the peripheral portion of an edge thereof, and having a step portion next to the projection, and a bond material in the form of a silicon paste being filled in said groove of said bottom of said molded resin case and engaging said projection of said metal base, the bonding material covering a surface of said step portion of said metal base.

2. An electronic circuit apparatus of an automobile comprising a metal base which mounts electronic circuits; a mold resin case which is connected to a peripheral portion of the metal base, and forms a space together with the metal base enclosing the electronic circuits therein, said case including a molded connector which is used for inputting and outputting an electric signal from the electronic circuits; said molded resin case having a groove along all of the peripheral portion of a bottom surface thereof, said metal base forming a projection along all the peripheral portion of an edge thereof, and having an inclined portion next to the projection, and a bonding material being filled in said groove of said bottom of said mold resin case and engaging said projection of said metal case, the bonding material covering a surface of said inclined portion next to said projection of said metal.

3. An electronic circuit apparatus of an automobile according to claim 1, wherein said metal base is connected to a plate.

4. An electronic circuit apparatus of an automobile according to claim 2, wherein said metal base is connected to a plate.

5. An electronic circuit apparatus of an automobile according to claim 2, wherein said bonding material a silicon.

6. An electronic circuit apparatus of an automobile according to claim 3, wherein a space is formed between a surface of said plate connected to said metal base and said step portion for reserving said paste on a surface of said step portion.

7. An electronic circuit apparatus of an automobile according to claim 4, wherein a space is formed between a surface of said plate connected to said metal base and said inclined portion of reserving said finding material on a surface of said inclined portion.

* * * * *